US011638353B2

(12) United States Patent
Davis et al.

(10) Patent No.: US 11,638,353 B2
(45) Date of Patent: Apr. 25, 2023

(54) APPARATUS AND METHOD FOR FORMING SENSORS WITH INTEGRATED ELECTRICAL CIRCUITS ON A SUBSTRATE

(71) Applicant: Hutchinson Technology Incorporated, Hutchinson, MN (US)

(72) Inventors: Michael W. Davis, Rockford, MN (US); Jeffery G. Ribar, Brownton, MN (US); Clark T. Olsen, Dassel, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 16/572,509

(22) Filed: Sep. 16, 2019

(65) Prior Publication Data

US 2020/0092998 A1 Mar. 19, 2020

Related U.S. Application Data

(60) Provisional application No. 62/732,477, filed on Sep. 17, 2018.

(51) Int. Cl.
| | |
|---|---|
| *H05K 1/18* | (2006.01) |
| *H05K 3/30* | (2006.01) |
| *G01L 1/22* | (2006.01) |
| *G01L 1/14* | (2006.01) |
| *G01K 7/16* | (2006.01) |

(52) U.S. Cl.
CPC .............. *H05K 1/181* (2013.01); *G01K 7/16* (2013.01); *G01L 1/142* (2013.01); *G01L 1/22* (2013.01); *H05K 3/303* (2013.01); *H05K 2201/10151* (2013.01)

(58) Field of Classification Search
CPC .......... H05K 1/00; H05K 1/02; H05K 1/0275; H05K 1/18; H05K 1/181–187; H01L 23/10; H01L 23/467; G06F 3/043–045; G06F 3/0412–0416; G06F 3/0488; G01L 1/20; G01L 1/205; G01L 1/00; G01L 1/22; G01L 1/142; G01L 1/2281–2287
USPC ........................ 361/760–767, 782–784, 803; 174/254–262; 73/765–766
See application file for complete search history.

(56) References Cited

U.S. PATENT DOCUMENTS 3,745,502 A * 7/1973 Watanabe ............. G01L 1/2287
 338/3
4,695,963 A 9/1987 Sagisawa et al.
(Continued)

FOREIGN PATENT DOCUMENTS

| CN | 104006914 A | 8/2014 |
| CN | 104204749 A | 12/2014 |
| CN | 107966236 A | 4/2018 |

OTHER PUBLICATIONS

International Search Report and Written Opinion in International Application No. PCT/US2019/051559, dated Nov. 19, 2019.
(Continued)

*Primary Examiner* — Tuan T Dinh
(74) *Attorney, Agent, or Firm* — DLA Piper LLP (US)

(57) ABSTRACT

An apparatus is described. The apparatus includes a substrate and one or more sensor components formed on the substrate. And, the apparatus includes one or more electrical circuits formed on the substrate electrically coupled with at least one of the one or more sensor components formed on the substrate.

10 Claims, 17 Drawing Sheets

(56) References Cited

U.S. PATENT DOCUMENTS

| | | | | |
|---|---|---|---|---|
| 5,184,520 | A | * | 2/1993 | Naito ................. G01G 3/18 |
| | | | | 73/862.623 |
| 5,901,046 | A | * | 5/1999 | Ohta ................. H01L 24/97 |
| | | | | 361/760 |
| 6,180,867 | B1 | | 1/2001 | Hedengren et al. |
| 7,791,898 | B2 | * | 9/2010 | Peytavy ............ H05K 1/0275 |
| | | | | 361/792 |
| 7,924,572 | B2 | * | 4/2011 | Mayuzumi ........ H05K 5/0034 |
| | | | | 361/753 |
| 7,948,758 | B2 | * | 5/2011 | Buhler ............. H05K 1/0206 |
| | | | | 361/689 |
| 8,107,248 | B2 | * | 1/2012 | Shin ................. H01L 24/24 |
| | | | | 174/254 |
| 8,640,549 | B2 | * | 2/2014 | Inamori ............ G01L 1/2293 |
| | | | | 73/766 |
| 9,201,468 | B2 | | 12/2015 | Schediwy |
| 9,441,940 | B2 | * | 9/2016 | Sumant .............. H01L 21/042 |
| 10,209,830 | B2 | * | 2/2019 | Pedder ............... G01L 1/2281 |
| 2004/0159161 | A1 | * | 8/2004 | Barnett .............. G01D 3/022 |
| | | | | 73/766 |
| 2004/0163478 | A1 | * | 8/2004 | Xu ................... H01L 41/314 |
| | | | | 257/E27.006 |
| 2005/0251047 | A1 | * | 11/2005 | Sleva ................ B06B 1/0688 |
| | | | | 600/459 |
| 2007/0032951 | A1 | * | 2/2007 | Tanenhaus ........... G01C 25/00 |
| | | | | 702/151 |
| 2009/0189866 | A1 | * | 7/2009 | Haffenden ........... G06F 3/0443 |
| | | | | 345/173 |
| 2010/0107770 | A1 | | 5/2010 | Serban et al. |
| 2010/0201635 | A1 | * | 8/2010 | Klinghult ........... G06F 3/0445 |
| | | | | 345/173 |
| 2013/0275057 | A1 | * | 10/2013 | Perlin ................. G06F 3/044 |
| | | | | 702/41 |
| 2014/0208823 | A1 | * | 7/2014 | Trusov ................ G01P 21/00 |
| | | | | 73/1.38 |
| 2014/0217566 | A1 | * | 8/2014 | Goida ................. H01L 23/10 |
| | | | | 257/676 |
| 2015/0002447 | A1 | | 1/2015 | Schediwy |
| 2015/0016487 | A1 | | 1/2015 | Britton et al. |
| 2015/0070604 | A1 | * | 3/2015 | Chen .................. G06F 3/0443 |
| | | | | 349/12 |
| 2016/0381798 | A1 | * | 12/2016 | Wu .................... G01D 11/30 |
| | | | | 361/748 |
| 2017/0023420 | A1 | * | 1/2017 | Vosgueritchian ......... G01L 1/22 |
| 2018/0045585 | A1 | * | 2/2018 | Keith ................. G01K 1/08 |
| 2018/0059839 | A1 | * | 3/2018 | Kim .................. H01L 51/5284 |
| 2018/0067612 | A1 | * | 3/2018 | Smith ................ G06F 3/0412 |
| 2018/0074638 | A1 | * | 3/2018 | Chiang ............... G06F 3/045 |
| 2018/0242912 | A1 | * | 8/2018 | Amimori .............. A61B 5/11 |

OTHER PUBLICATIONS

International Preliminary Report on Patentability in International Application No. PCT/US2019/051559, dated Mar. 25, 2021.

Office Action in Chinese Patent Application No. 201980060729.9, dated Oct. 10, 2022.

* cited by examiner

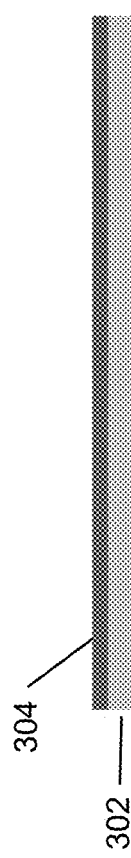
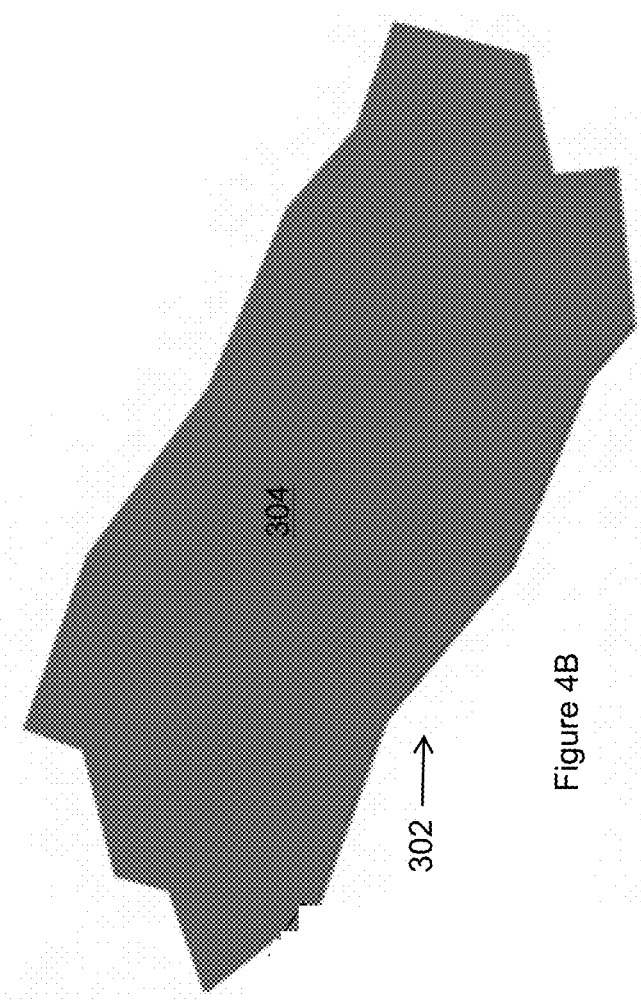

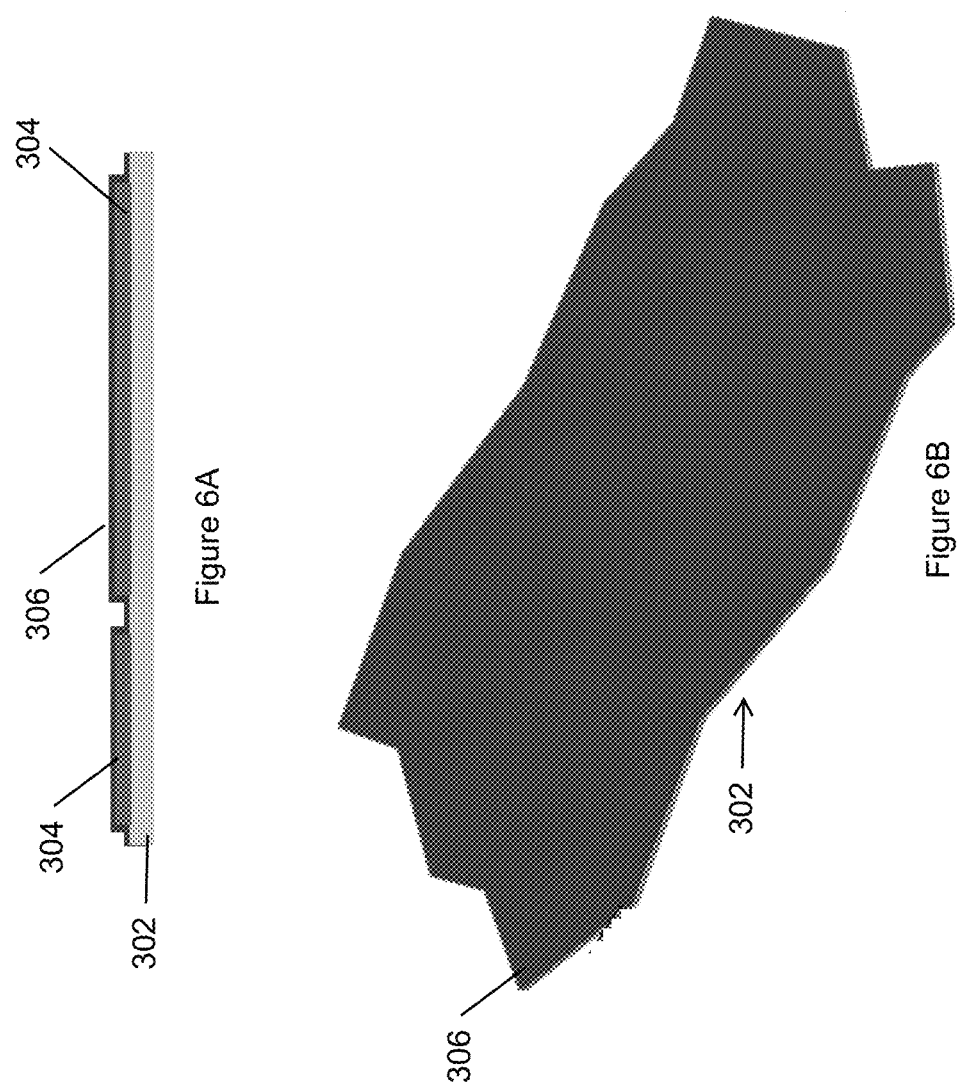

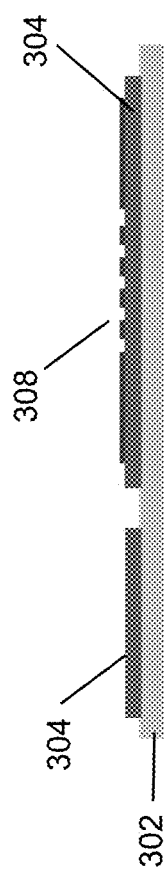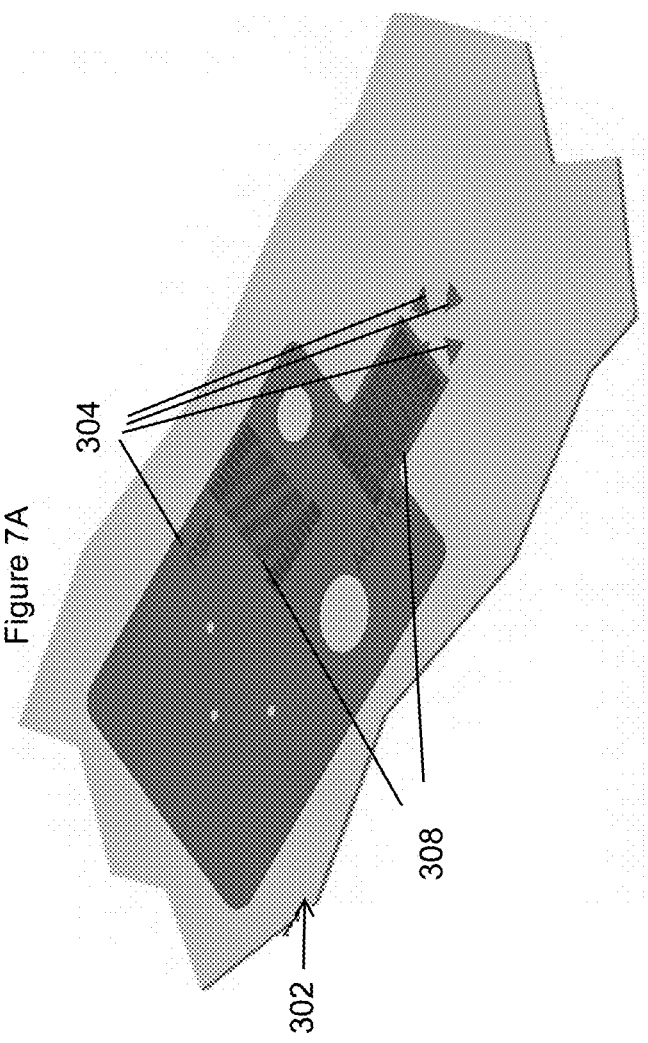
Figure 7A
Figure 7B

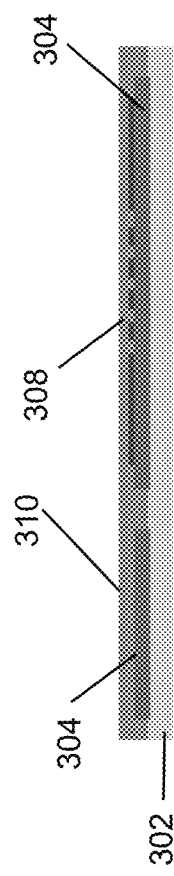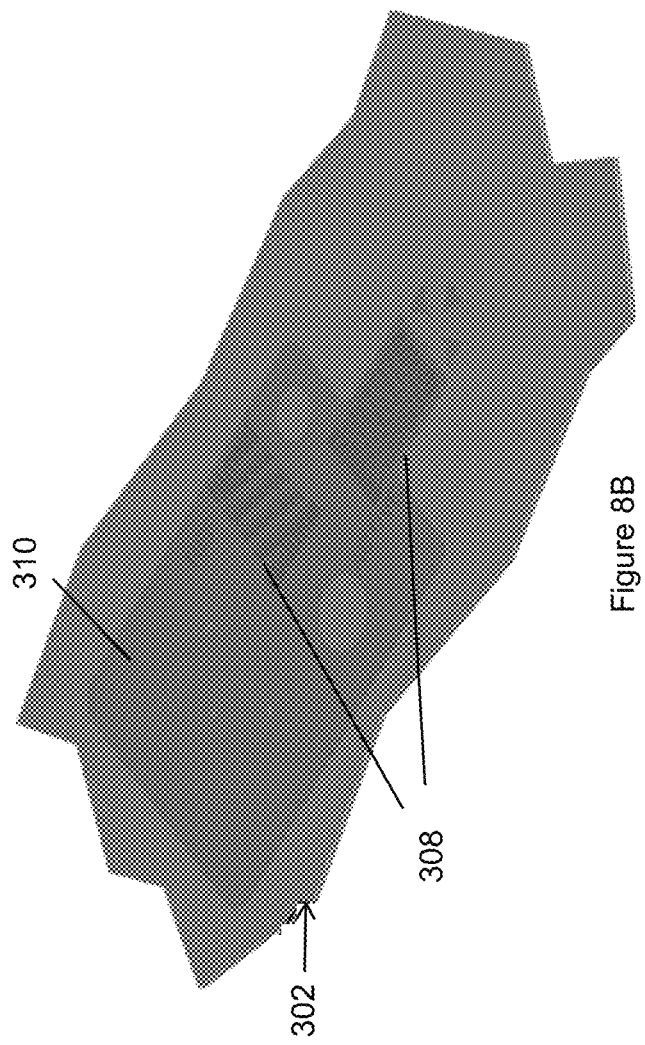

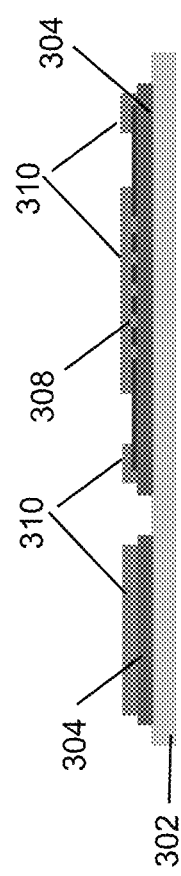
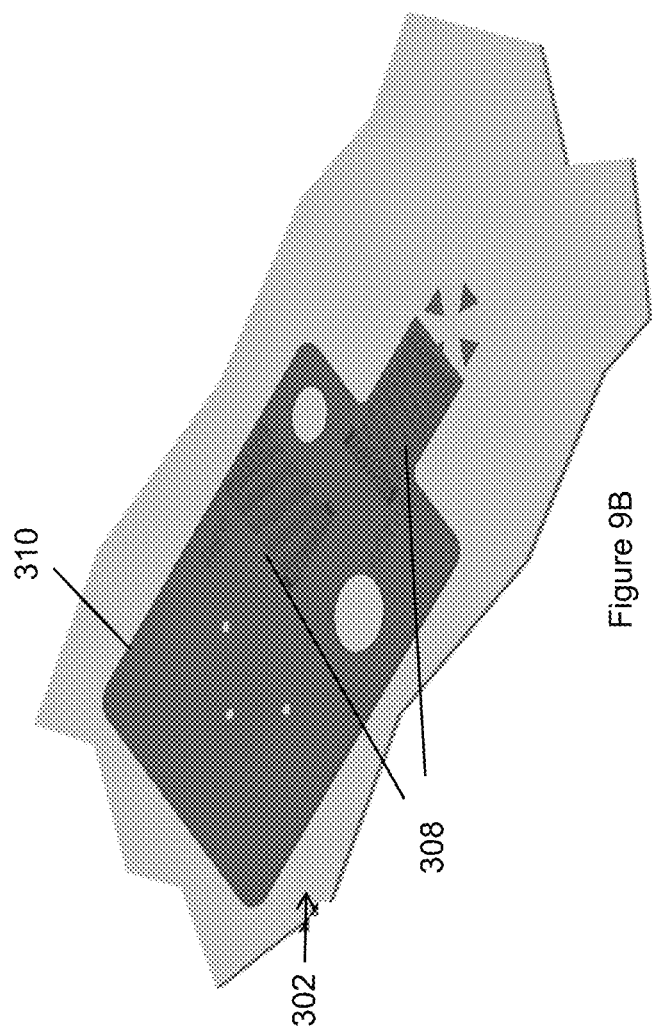
Figure 9B

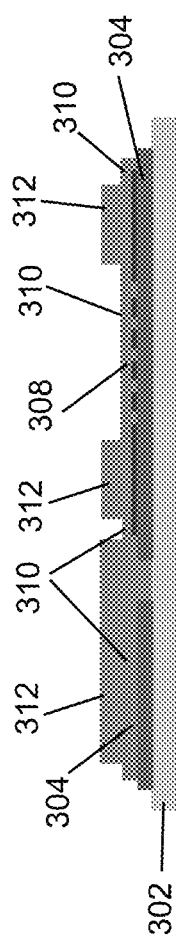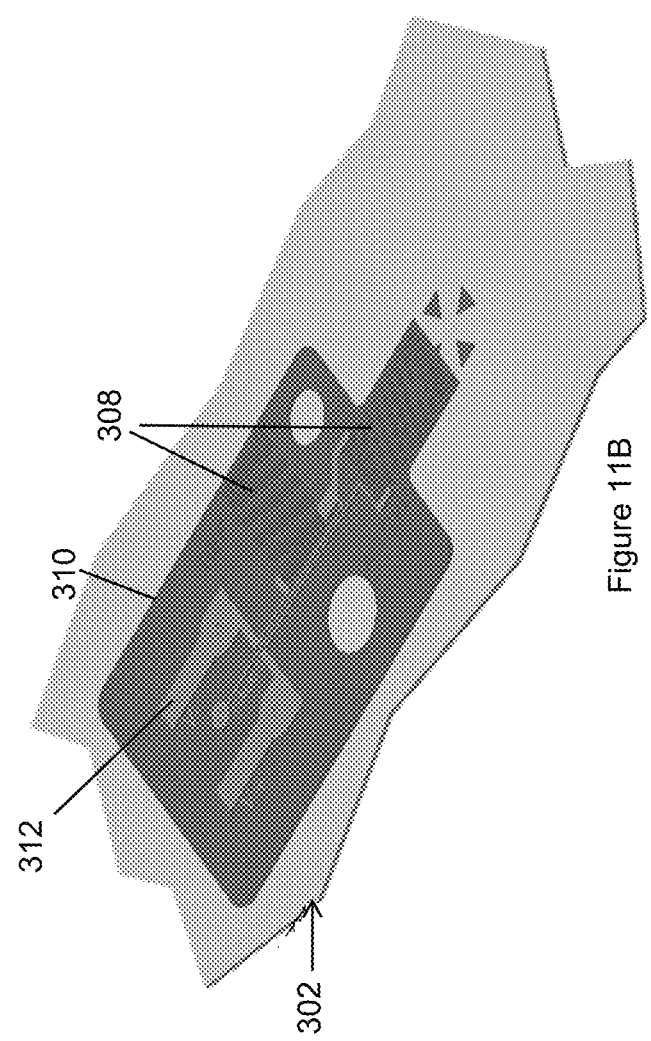
Figure 11A
Figure 11B

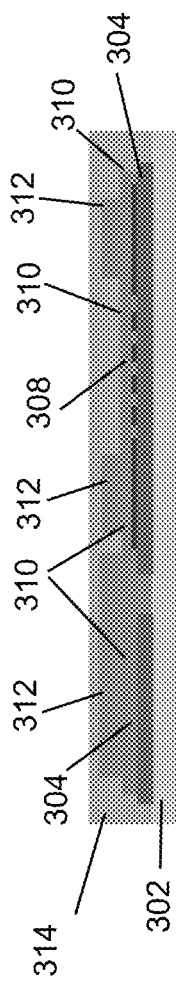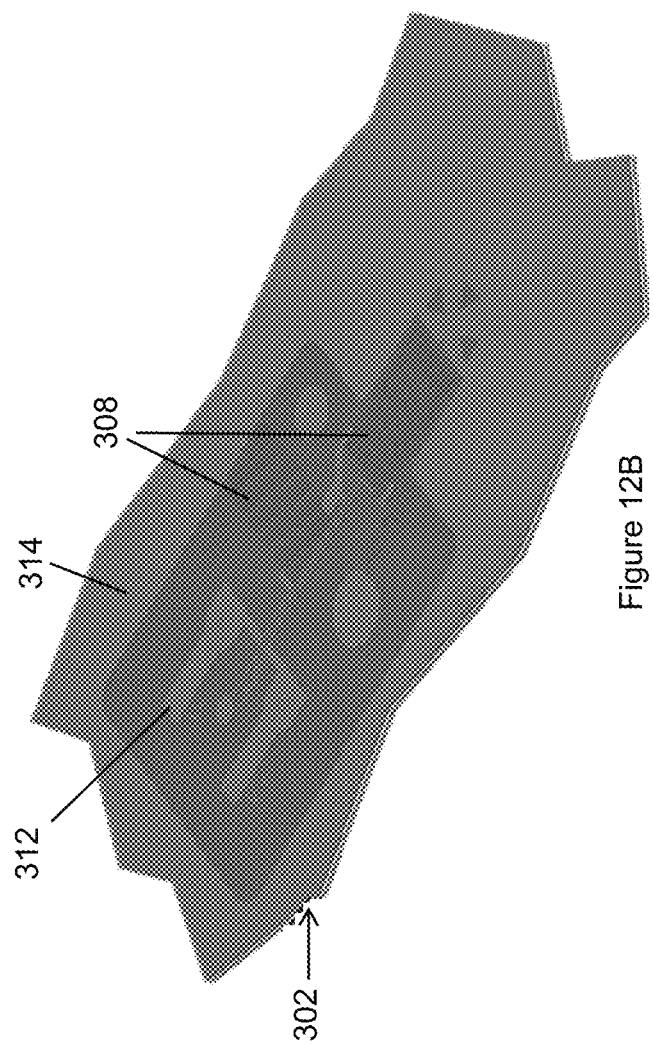

APPARATUS AND METHOD FOR FORMING SENSORS WITH INTEGRATED ELECTRICAL CIRCUITS ON A SUBSTRATE

CROSS-REFERENCE TO RELATED APPLICATIONS

This application claims the benefit of U.S. Provisional Application No. 62/732,477 filed on Sep. 17, 2018, which is hereby incorporated by reference in its entirety.

FIELD

Embodiments of the invention relate to electrical components. In particular, embodiments of the invention relate generally to electrical components integrated with electrical circuits.

BACKGROUND

Current techniques for forming devices that including circuits and sensors are limited in the ability to integrate the circuits and sensors into desired products. The use of discrete components limits the size of the current devices and fail to meet the performance needs that are required. Further, the current manufacturing techniques can have long lead times and can be cost prohibitive to meet the desired size and performance characteristics.

SUMMARY

An apparatus is described. The apparatus including a substrate; one or more sensor components formed on the substrate; and one or more electrical circuits formed on the substrate electrically coupled with at least one of the one or more sensor components formed on the substrate.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which:

FIGS. 3-18 illustrate a process for manufacturing a device including one or more active/passive components integrated with electrical substrates according to an embodiment.

DETAILED DESCRIPTION

Active and/or passive components integrated into one or more integrated electrical circuits and methods of manufacturing in accordance with embodiments are described. For example, sensors such as a resistance temperature detector (RTD) (e.g., formed from Nickel, Nickel-Chromium and/or platinum), thermocouple, strain gauge (e.g., formed from constantan), a capacitance sensor, a thermopile, a thermistor, heater (e.g., formed from NiChrome), reference electrodes (e.g., formed from Silver/SilverChloride), electrical sensors/ stimulators (e.g., formed from gold or platinum electrodes) such as for an electrocardiography (EKG) or medical electromapping patch. The active and/or passive components include wireless communication components integrates with one or more electric circuits and/or other active and/or passive components.

For some embodiments, the one or more electrical circuits are formed on a substrate on a separate layer than the passive/active component. The one or more electrical circuits can be electrically coupled with one or more passive/ active components through one or more vias through an insulating layer, for example. Embodiments include multiple types of active/passive elements disposed on multiple layers, each type being on its own separate layer. However, some embodiments include one or more electrical circuits and one or multiple types of active/passive components disposed on the same layer. The active or passive component(s) can be constructed using techniques including, but not limited to, an additive thin film, plated, etched, and coated sensor material.

Figure 1:
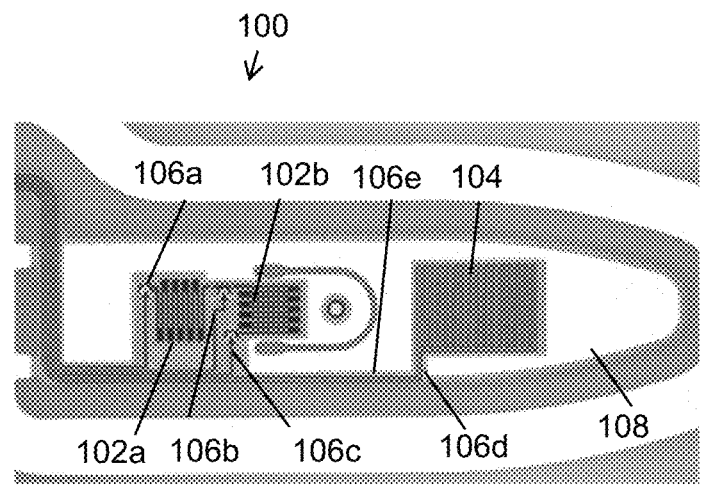
FIG. 1 illustrates a device including a plurality of sensors integrated with electrical circuits according to an embodiment.

FIG. 1 illustrates a device including a plurality of sensors integrated with electrical circuits according to an embodiment. The device 100 includes a plurality of strain gauge sensors 102a and 102b and an RTD sensor 104 electrically coupled with one or more electrical circuits through a plurality of traces 106b-106e. The sensors, the electrical circuits and the traces are integrally formed on the same substrate 108 using similar manufacturing techniques. This removes the need for discrete components to be added to a substrate including electrical circuits, which requires mounting pads for electrically coupling the discrete components to the electrical circuits. The discrete components including packaging and contacts to mount to the substrate require extra space. Further, the packaging of the discrete components and the mounting pads result in parasitic losses, such as capacitive and resistive losses, that can change the characteristics of the electrical circuits across each device and degrade performance of the electrical circuits from optimum operating characteristics.

A device including a plurality of active/passive components integrated with electrical circuits does away with the bulky packaging required for discrete components and the mounting pads. Thus, devices according to the embodiments described herein can have smaller dimensions because the integrated active passive components do not have the packaging of discrete components and do not require mounting pads. Further, devices according to the embodiments described herein will not have the parasitic losses that result from mounting pads. In addition, the ability to manufacture the active/passive components with the electrical circuits disposed on the substrate enables better performance characteristics and tighter operating ranges since the active/ passive components and the electrical circuits are manufactured using similar techniques.

Figure 2:
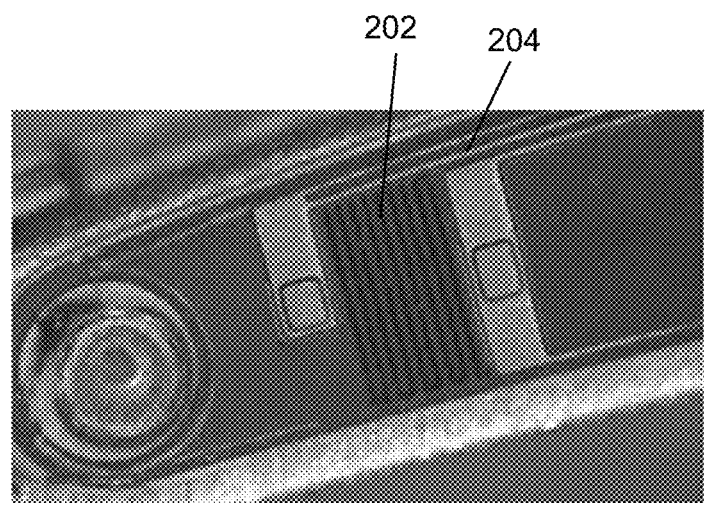
FIG. 2 illustrates an RTD integrated with electrical circuits according to an embodiment.

FIG. 2 illustrates an RTD sensor integrated with electrical circuits according to an embodiment. The RTD sensor 202 is integrated with one or more electrical circuits 204 using techniques including those described herein.

FIGS. 3-18 illustrate a process for manufacturing a device including one or more active/passive components integrated with each electrical substrate according to an embodiment. Integrally forming one or more active/passive components with electrical circuits on the same substrate enables the ability to miniaturize devices compared to the current state of devices, for example, those devices that require the use of discrete components to be affixed to circuit boards. Further, integrally forming the one or more active/passive components with the electrical circuits on the same substrate enables the use of smaller packages. This also enables the devices, according to embodiments described herein, to be self-contained, which enables the devices to be used in harsher environments where devices not formed according to embodiments described herein would result in malfunctions or failure.

Figure 3:
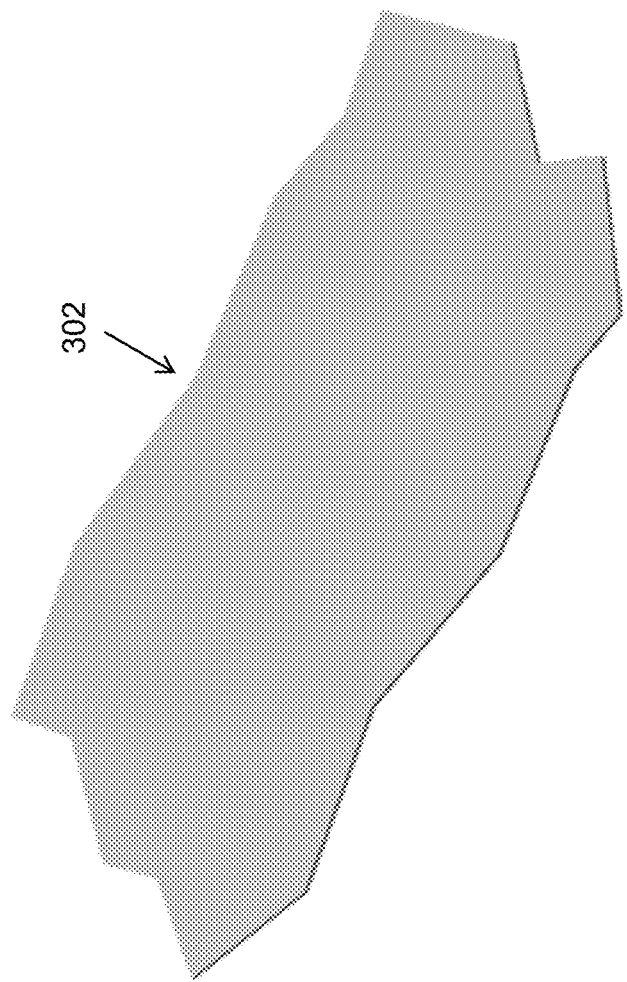

Referring to FIG. 3, a substrate 302 is prepared to form one or more active/passive components integrated with one or more electrical circuits. A substrate 302 may include, but is not limited to, stainless steel, copper, a polymer film, ceramic, glass, semiconductor, nitinol, and other materials. For some embodiments, the substrate 302 is in the form of a roll used in a reel to reel manufacturing process.

FIG. 4 illustrates a substrate with a dielectric layer disposed thereon. FIG. 4A illustrates a cross-sectional view of a substrate 302 with a dielectric layer 304 disposed thereon. FIG. 4B illustrates a perspective view of the substrate 302 with the dielectric layer 304 disposed thereon. A dielectric layer 304 is disposed on a substrate 302 according to some embodiments. For embodiments that do not use a conductive substrate, a dielectric layer 304 disposed on the substrate 302 may not be needed. The dielectric layer 304 includes, but is not limited to, a photoresist, polyimide, KMPR, and SU-8 or other insulating materials. For some embodiments, the dielectric layer 304 is disposed on the substrate 302 using a coating (liquid coating or dry film coating) technique. However, a dielectric layer 304 can be formed on the substrate 302 using other techniques including those known in the art.

Figure 5A:
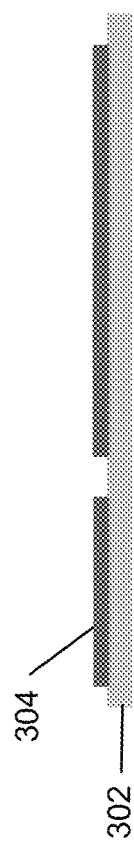
Figure 5B:
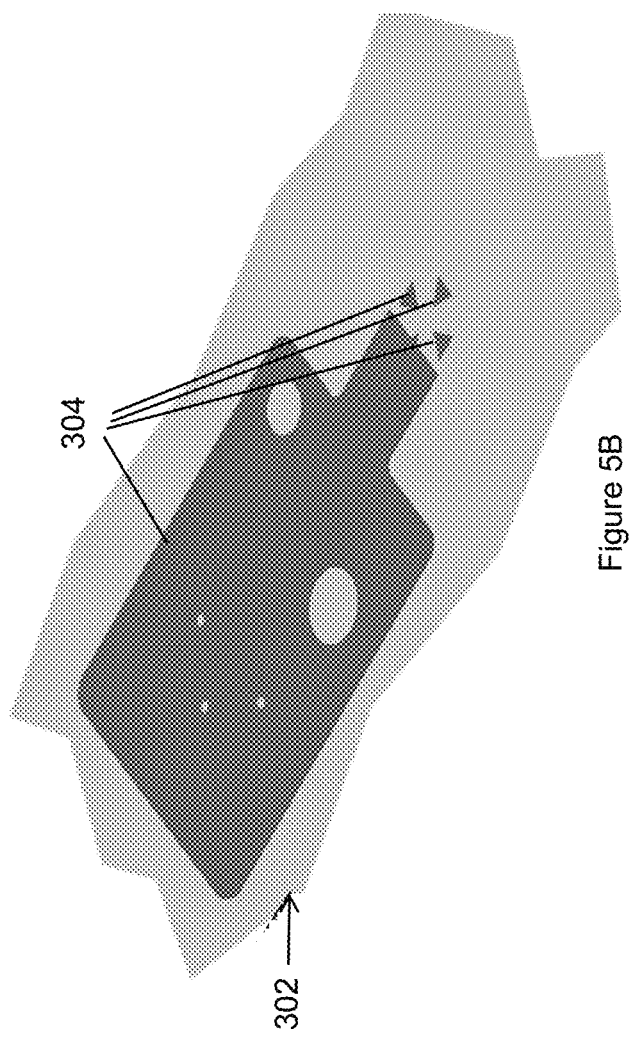

FIG. 5 illustrates a substrate with a dielectric layer that has been patterned according to an embodiment. FIG. 5A illustrates a cross-sectional view of a substrate 302 with a dielectric layer 304 that has been patterned according to an embodiment. FIG. 5B illustrates a perspective view of the substrate 302 with the dielectric layer 304 that has been patterned according to an embodiment. For some embodiments, a photoresist layer is formed on the dielectric layer 304. The photoresist, according to some embodiments, is exposed using photolithography techniques including those known in the art and developed using wet etch techniques including those known in the art. This patterned photoresist layer is used to create the pattern for the dielectric layer 304 during a dielectric removal process, either wet or dry techniques can be used. For other embodiments, the dielectric layer 304 is a photosensitive polyimide layer and is patterned directly using photolithography techniques including those known in the art and developed using wet etch techniques including those known in the art. Still another patterning method is laser ablation of the unwanted dielectric.

FIG. 6 illustrates a metal layer disposed on the dielectric layer according to an embodiment. FIG. 6A illustrates a cross-sectional view of a metal layer 306 disposed on the dielectric layer 304 according to an embodiment. FIG. 6B illustrates a perspective view of the metal layer 306 disposed on the dielectric layer 304 according to an embodiment. A metal layer 306 is formed on the dielectric layer 304 using techniques including, but not limited to, physical vapor deposition, chemical vapor deposition, and electroless chemical deposition. For some embodiments, a seed layer is formed on the dielectric layer 304 as a first step to forming a metal layer 306. For example, a seed layer such as nickel-chromium is sputtered on the dielectric layer 304. Copper, for example, is deposited on the seed layer using electroless chemical deposition. According to some embodiments, the metal layer 306 is used to form one or more sensors on the dielectric layer 304. For some embodiments, the metal layer 306 is constantan sputtered on the dielectric layer 304 to form one or more strain gauges.

According to some embodiments, forming sensors in the metal layer 306 includes depositing a photoresist layer on the metal layer, such as a constantan layer, and patterning the photoresist layer. The photoresist layer is applied using techniques including, but not limited to, liquid slot die, roller coat, spray, curtain coat, dry film lamination, and screen-printing techniques. The photoresist is patterned, for example, using photolithography and etching techniques including those known in the art. Portions of the metal layer 306 exposed by etching away portions of the photoresist layer are then etched to form sensors, electrical traces, electrical contacts, and other circuit components. According to some embodiments, laser ablation is used to form the sensors, electrical traces, electrical contacts, and other circuit components from the metal layer.

FIG. 7 illustrates strain gauges 308 formed on a dielectric layer 304 according to an embodiment. FIG. 7A illustrates a cross-sectional view of strain gauges 308 formed on a dielectric layer 304 according to an embodiment. FIG. 7B illustrates a perspective view of the strain gauges 308 formed on a dielectric layer 304 according to an embodiment. The metal layer 306 formed on the dielectric layer 304 is patterned and etched using techniques including those known in the art. For example, a photoresist is formed on the metal layer 306 using techniques including those known in the art. The photoresist is patterned and etched using techniques including those described herein.

FIG. 8 illustrates a second dielectric layer formed over strain gauges according to an embodiment. FIG. 8A illustrates a cross-sectional view of a second dielectric layer 310 formed over strain gauges 308 according to an embodiment. FIG. 8B illustrates a perspective view of the a second dielectric layer 310 formed over strain gauges 308 according to an embodiment. Once one or more sensors are formed on the first dielectric layer 304 as described herein, a second dielectric layer 310 is formed on the one or more sensors formed. Applying a second dielectric layer 310 after the one or more sensors are formed separates the sensor(s) from other structures formed in subsequent steps and protects the sensor(s) from damage than can occur during further processing of the device. For some embodiments, the second dielectric layer 310 is a polyimide layer formed using techniques including those described herein.

FIG. 9 illustrates a substrate 302 with a second dielectric layer that has been patterned according to an embodiment. FIG. 9A illustrates a cross-sectional view of a substrate with a second dielectric layer 310 that has been patterned according to an embodiment. FIG. 9B illustrates a perspective view of the substrate 302 with a second dielectric layer 310 that has been patterned according to an embodiment. The second dielectric layer 310 is pattered using photolithography techniques including those known in the art and developed using wet etch techniques including those known in the art.

Figure 10A:
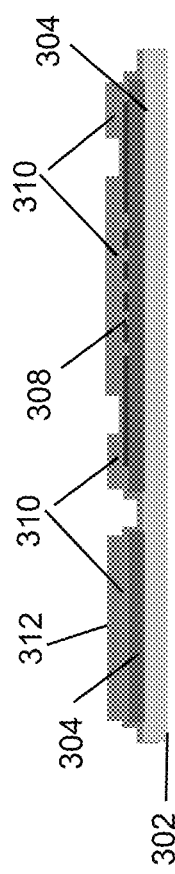
Figure 10B:
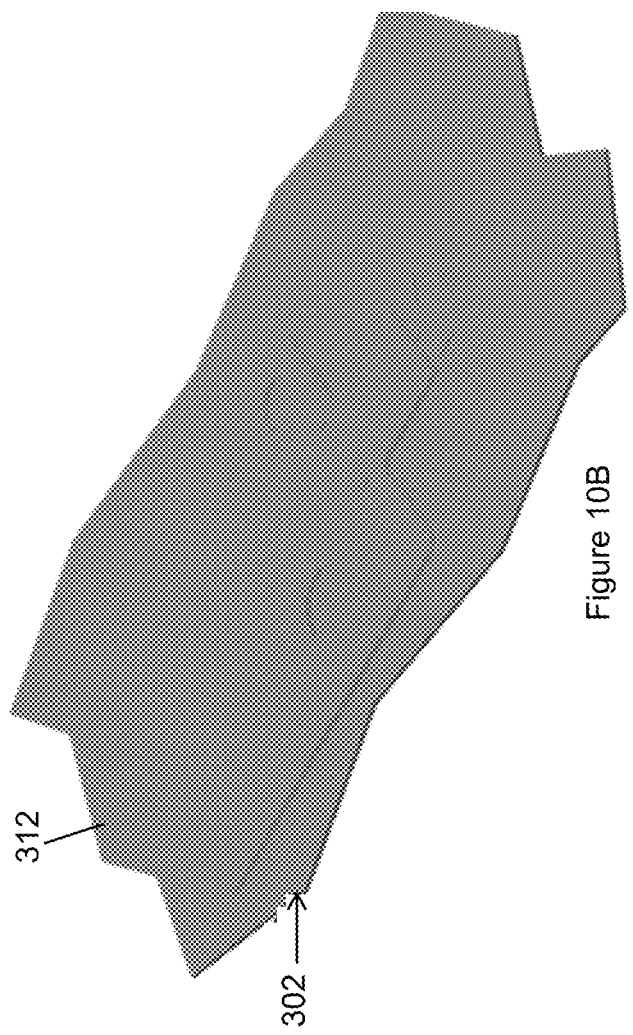

FIG. 10 illustrates a second metal layer 312 formed on the second dielectric layer 310 according to an embodiment. FIG. 10A illustrates a cross-sectional view of a second metal layer 312 formed on the second dielectric layer 310 according to an embodiment. FIG. 10B illustrates a perspective view of the second metal layer 312 formed on the second dielectric layer 310 according to an embodiment. The second metal layer 312 is formed on the second dielectric layer 310 using techniques including, but not limited to, physical vapor deposition, chemical vapor deposition, and electroless chemical deposition. For some embodiments, a seed layer is formed on a dielectric layer as a first step to forming a metal layer, such as the second metal layer 312. For example, a seed layer such as nickel-chromium is sputtered on the dielectric layer. Copper, for example, is deposited on the seed layer using electroless chemical deposition or electroplating. According to some embodiments, the second metal layer 312 is used to form one or more traces, vias, and electrical circuits. For example, the second metal layer 312 can include traces and vias to interconnect one or more sensors formed or to be formed on the substrate and connect the one or more sensors to other electrical circuits. FIG. 11 illustrates traces, electrical circuits, and vias formed from a metal layer using techniques according to an embodiment. FIG. 11A illustrates a cross-sectional view of traces, electrical circuits, and vias formed from a metal layer using techniques according to an embodiment. FIG. 11B illustrates a perspective view of the traces, electrical circuits, and vias formed from a metal layer using techniques according to an embodiment. For some embodiments, the second metal layer 312 is patterned to include one or more sensors and another dielectric layer is formed over the second sensor layer and another metal layer is formed to include traces, electrical circuits, and/or vias. Thus, one skilled in the art would understand any number of dielectric layers and patterned metal layers can be formed to include any number and type of sensors and electrical circuits using techniques including those herein.

FIG. 12 illustrated a third dielectric layer 314 disposed on the patterned metal layer according to an embodiment. FIG. 12A illustrates a cross-sectional view of a third dielectric layer 314 disposed on the patterned metal layer according to an embodiment. FIG. 12B illustrates a perspective view of the third dielectric layer 314 disposed on the patterned metal layer according to an embodiment. The third dielectric layer 314 is formed using techniques including those described herein. For example, the third dielectric layer 314 is a polyimide layer.

Figure 13A:
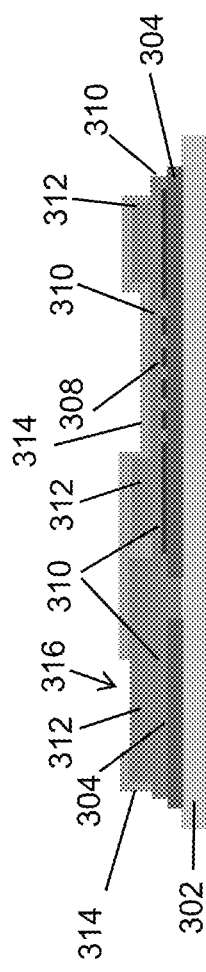
Figure 13B:
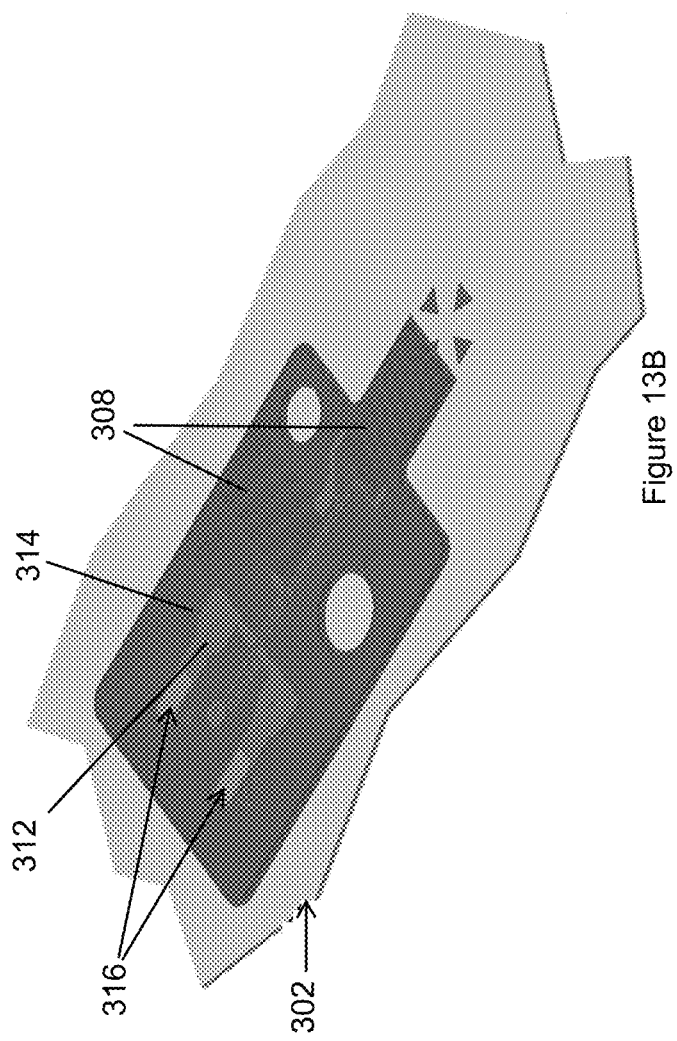

FIG. 13 illustrated the third dielectric layer 314 patterned to form one or more openings 316 in the third dielectric layer. FIG. 13A illustrates a cross-sectional view of the third dielectric layer 314 patterned to form one or more openings 316 in the third dielectric layer. FIG. 13B illustrates a perspective view of the third dielectric layer 314 patterned to form one or more openings 316 in the third dielectric layer. The dielectric layer is patterned using techniques including those described herein. For some embodiments, one or more openings 316 formed in the dielectric layer removes a portion of the dielectric layer to expose one or more of any of a trace, via, and an electrical circuit. Such openings are used, for example, to interconnect one or more electrical circuits and/or sensors to other electrical circuits and/or other sensors formed using techniques including those described herein.

Figure 14A:
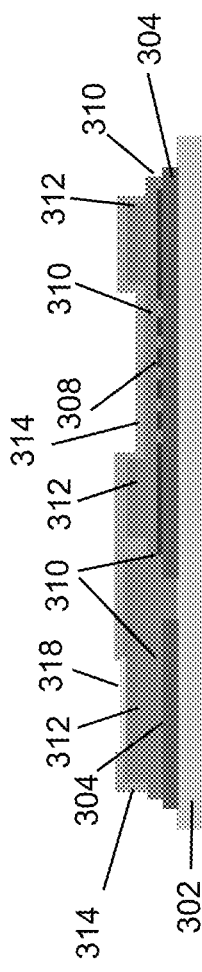
Figure 14B:
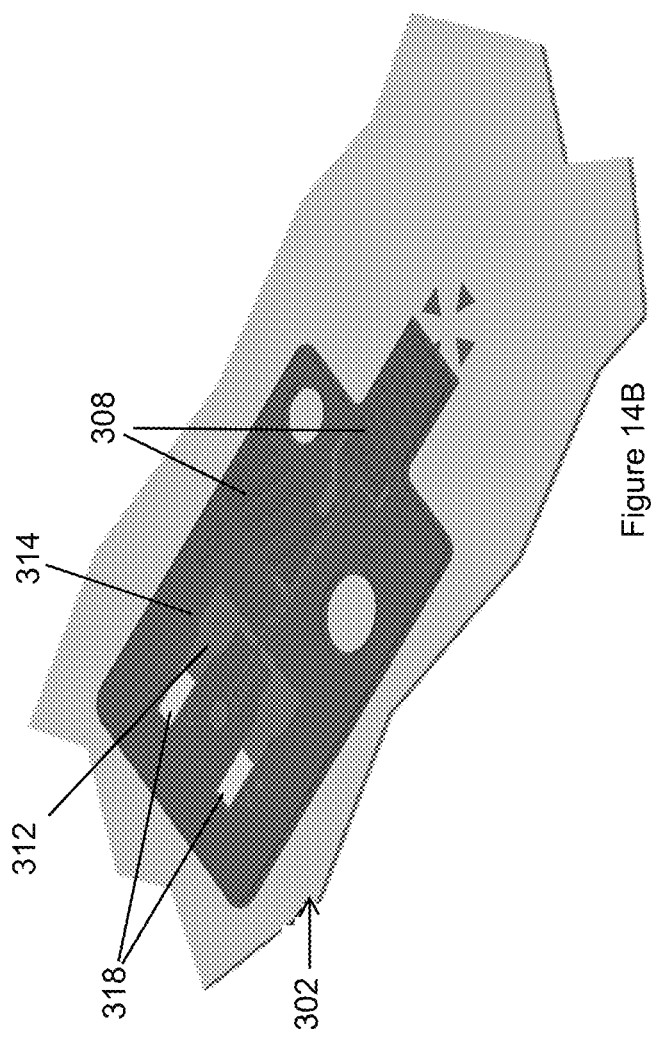
Figure 15A:
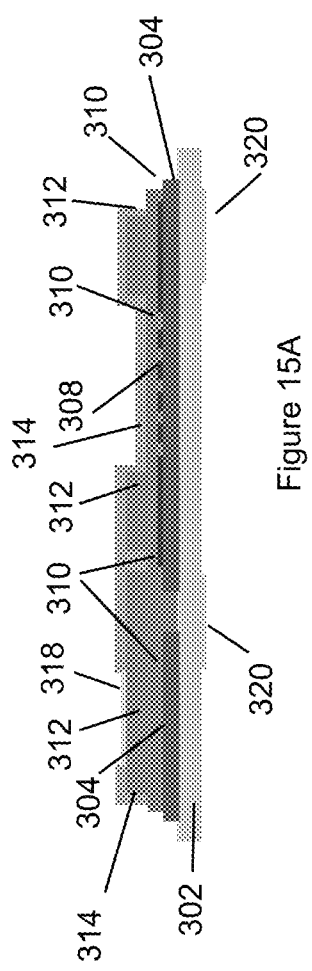
Figure 15B:
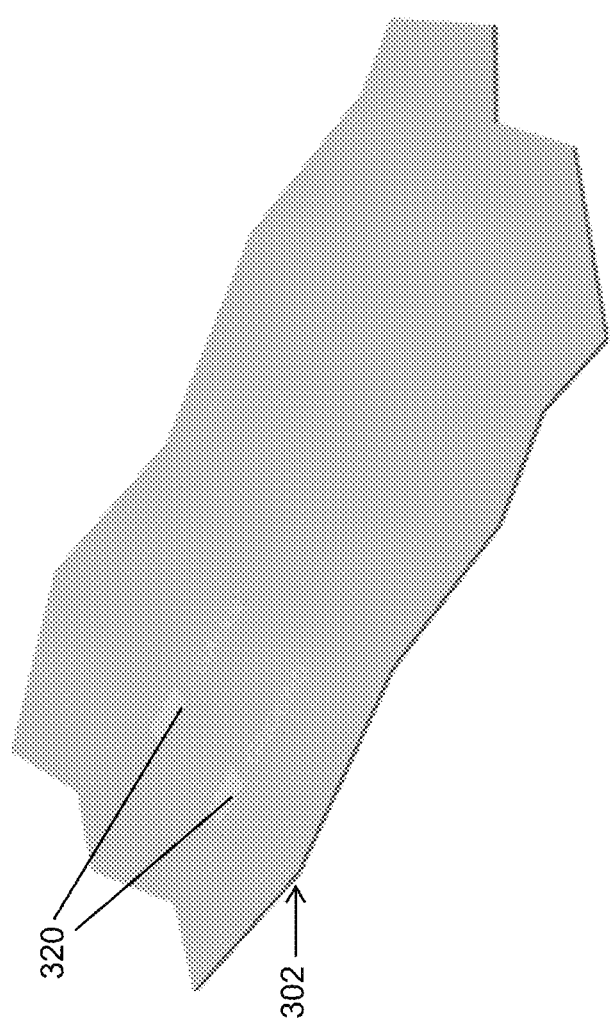

FIG. 14 illustrates gold plated pads 318 formed according to an embodiment. FIG. 14A illustrates a cross-sectional view of gold plated pads 318 formed according to an embodiment. FIG. 14B illustrates a perspective view of the gold plated pads 318 formed according to an embodiment. For some embodiments, one or more portions of the exposed metal layer is gold plated. For example, one or more portions are gold plated to form electrical contacts. The metal layer 312 is gold plated using one or more of deposition techniques and patterning techniques including those described herein. FIG. 15 illustrates gold plated pads 320 formed on a side of the substrate opposite from the side having the one or more dielectric layers and patterned metal layers formed thereon. FIG. 15A illustrates a cross-sectional view of gold plated pads 320 formed on a side of the substrate opposite from the side having the one or more dielectric layers and patterned metal layers formed thereon. FIG. 15B illustrates a perspective view of the gold plated pads 320 formed on a side of the substrate opposite from the side having the one or more dielectric layers and patterned metal layers formed thereon. The gold plated pads 320 are formed using one or more of deposition techniques and patterning techniques including those described herein. For such embodiments, the substrate 302 is a metal layer and the gold plated pads 320 formed on the substrate are used to form one or more ground and/or negative terminals for one or more electrical circuits and/or one or more sensors formed or to be formed on the device.

Figure 16A:
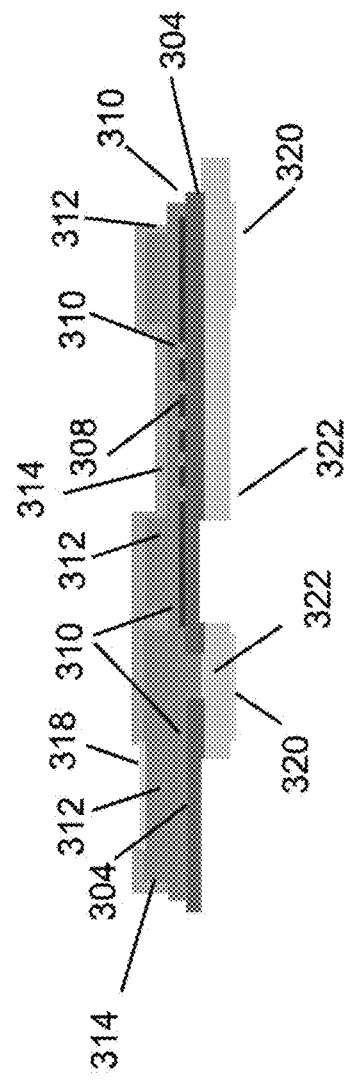
Figure 16B:
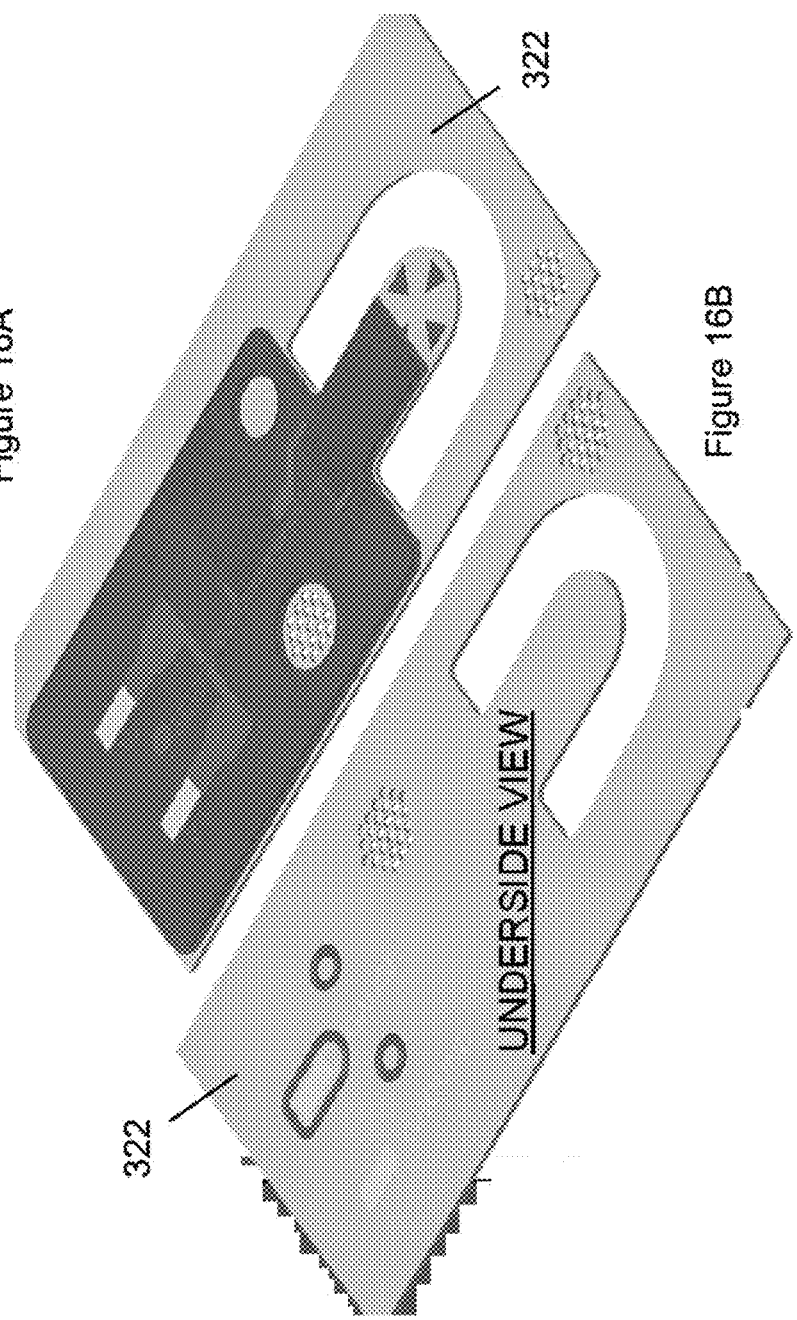

FIG. 16 illustrates a patterned substrate layer 322 according to an embodiment. FIG. 16A illustrates a cross-sectional view of a patterned substrate layer 322 according to an embodiment. FIG. 16B illustrates a perspective view of the patterned substrate layer 322 (the top side and the underside) according to an embodiment. The substrate is patterned using techniques described herein, for example, those related to patterning a metal layer. Further, the substrate could be patterned using laser ablation techniques including those known in the art. For some embodiments, the substrate is patterned to form at least a portion of one or more circuits and/or to give the device a desired shape. The desired shape can include, but is not limited to, shaping for a package, shaping for mounting, forming holes for mounting hardware, or forming other mechanical features. For some embodiments, the patterning includes forming textures or patterns in the substrate using patterning techniques including those described herein.

Figure 17:
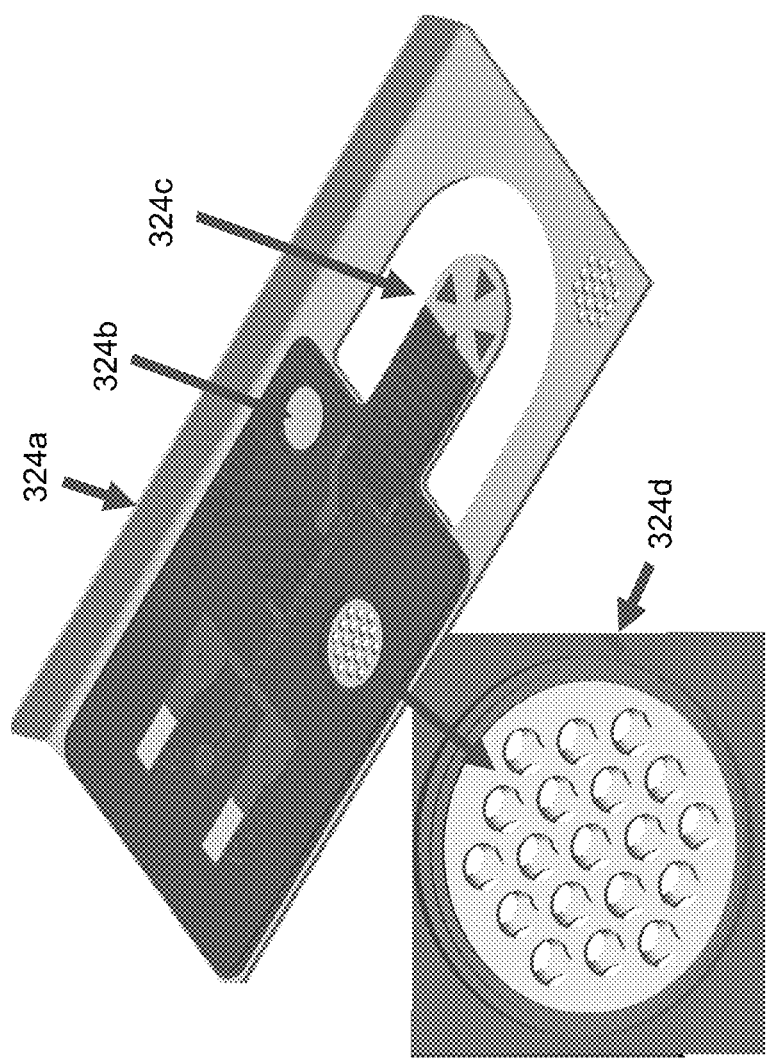

FIG. 17 illustrated the device formed to include mechanical features 324 according to an embodiment. For some embodiments, the device is patterned or molded to include mechanical features 324 that enable desired mechanical characteristics and/or for incorporation into system. For example, the substrate is bent or other molded to include a stiffener rail form. Other mechanical features 324 can also include one or more weld points for affixing the device into a system or for affixing another device or circuit to the substrate. Further, the substrate can be patterned using techniques including those described herein to include one or more high surface area adhesive attached features to enable better adhesion for adhesives applied to the subtracted. The adhesive can be applied to the substrate to affix one or more components or attached the device to a system.

Figure 18:
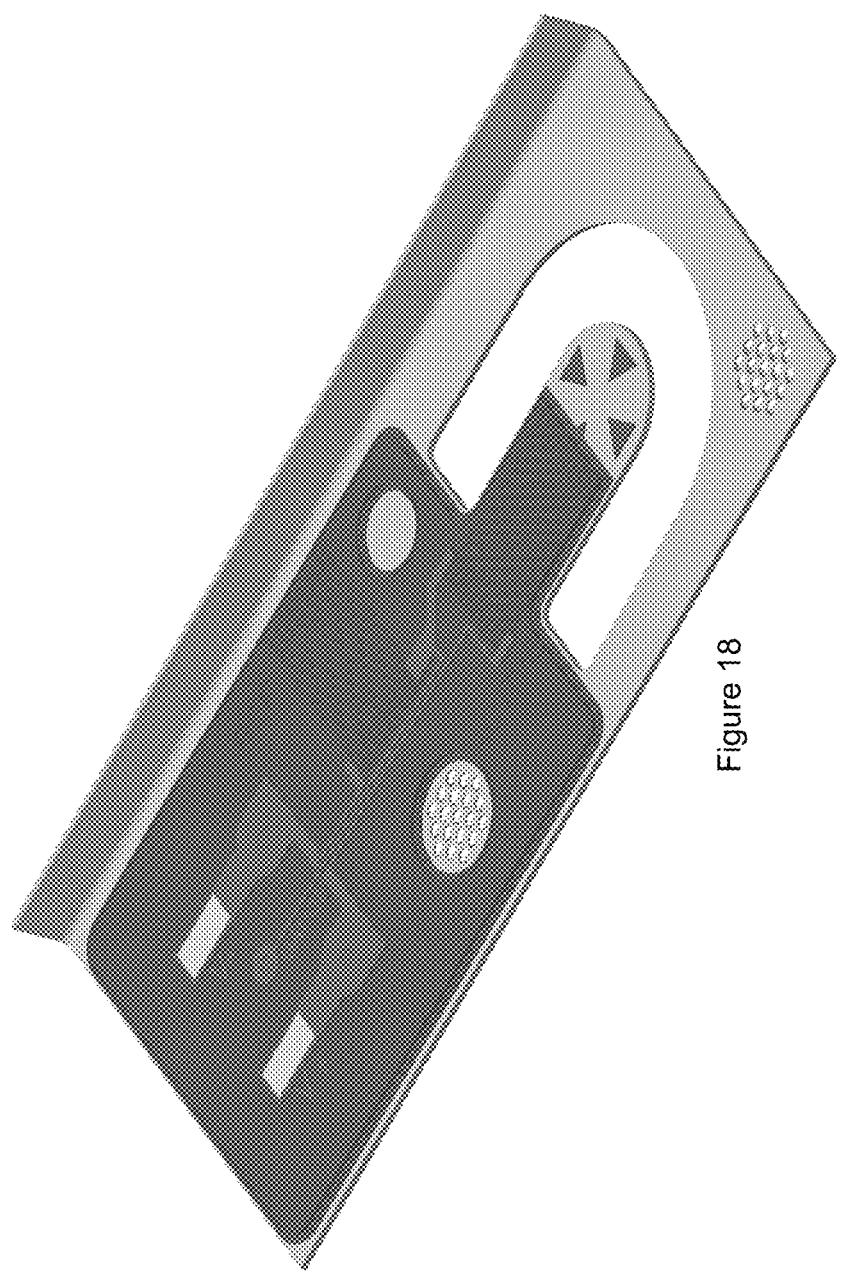

FIG. 18 illustrated a formed device according to an embodiment. The formed device may include one or more types of sensors including those described herein. Each type of sensor can be formed on a same layer as other sensors or can be formed on separate layers using techniques including those described herein. The formed device may also include one or more contact pads for mounted discrete components to the device, for example to complete one or more electrical circuits formed on the device. Further, the one or more contact pads can be configured to electrical couple the formed device to another system. For some embodiments, the one or more electrical circuits formed on the device can include electrical circuits configured as wireless communication circuits or portions thereof. For example, the device could include one or more coils, antennas, inductors, capacitors, stub features, or other elements of a wireless communication circuit.

For some embodiments, the one or more electrical circuits can be formed to include traces and other features having a line spacing in a range including, but not limited to 8 microns to 12 microns. However, one skilled in the art would understand that larger and smaller line spacings could be used.

For some embodiments, a temperature sensor according to an embodiment is configured as a resistance temperature detector electrically coupled with a first electrical trace and a second electrical trace. The temperature sensor is configured as a serpentine line disposed on a dielectric layer. The serpentine line is electrically connected to the first electrical trace at a first end of the serpentine line and is electrically connected to the second electrical trace at a second end of the serpentine line.

According to some embodiments, the substrate is attached to a web of a reel to reel manufacturing process to form one or more sensors and/or electrical circuits as described herein. The reel to reel manufacturing process forms and patterns any metal layers and any dielectric layers and the one or more sensors and electrical circuits using techniques including those describe herein.

Although described in connection with these embodiments, those of skill in the art will recognize that changes can be made in form and detail without departing from the spirit and scope of the invention.

What is claimed is:

1. An apparatus comprising:
   a substrate;
   one or more sensors formed in a first metal layer on the substrate;
   a first dielectric layer disposed between the substrate and the first metal layer, the first dielectric layer patterned such that the one or more sensors are disposed on the first dielectric layer;
   one or more electrical circuits formed on the substrate in a second metal layer separate from the one or more sensors and electrically coupled with at least one of the one or more sensors formed on the substrate using a via formed in the second metal layer; and
   a second dielectric layer disposed between the first metal layer and the second metal layer, wherein the second dielectric layer is patterned such that the one or more electrical circuits are disposed on the second dielectric layer, and wherein the via connects the one or more electrical circuits to the one or more sensors.

2. The apparatus of claim 1, wherein at least one of the one or more sensors is a resistance temperature detector.

3. The apparatus of claim 1, wherein at least one of the one or more sensors includes multiple resistance temperature detectors.

4. The apparatus of claim 1, wherein at least one of the one or more sensors is a pressure sensor.

5. The apparatus of claim 1 includes any one or more of an internet of things device, a medical device, a smart sensor, a home automation device, an industrial sensor, an automotive sensor, environmental device, security device, a public safety device, a retail device, a logistics device, and a consumer device.

6. The apparatus of claim 4, wherein the pressure sensor is a strain gauge.

7. The apparatus of claim 4, wherein the pressure sensor is a capacitive sensor.

8. A method for forming a sensor with an integrated electrical circuit comprising:
   disposing a first dielectric layer over a substrate;
   etching the first dielectric layer to remove a portion of the first dielectric layer;
   disposing a first metal layer over the first dielectric layer;
   etching the first metal layer to form one or more sensors on the substrate, wherein the one or more sensors are disposed over a remaining portion of the first dielectric layer;
   forming one or more electrical circuits on the substrate in a second metal layer separate from the one or more sensors,
   forming at least one via in the second metal layer connecting the one or more sensors to the one or more electrical circuits; and
   disposing a second dielectric layer over the first metal layer; and
   etching the second dielectric layer to remove a portion of the second dielectric layer, wherein the one or more electrical circuits are disposed over a remaining portion of the second dielectric layer.

9. The method of claim 8, wherein forming the first one or more sensors on the substrate includes forming at least a first sensor of the one or more sensors on a separate layer disposed on the substrate from at least a second sensor.

10. The method of claim 8, wherein forming the first one or more sensors on the substrate includes forming a first sensor and a second sensor on a same dielectric layer disposed on the substrate.

* * * * *